(12) United States Patent
Song et al.

(10) Patent No.: US 8,993,994 B2
(45) Date of Patent: Mar. 31, 2015

(54) LIGHT-EMITTING DEVICE AND ORGANIC LIGHT EMITTING DISPLAY APPARATUS INCLUDING THE SAME

(75) Inventors: Jung-Bae Song, Yongin (KR); Sang-Pil Lee, Yongin (KR); Young-Rok Song, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/537,001

(22) Filed: Jun. 28, 2012

(65) Prior Publication Data
US 2013/0001578 A1 Jan. 3, 2013

(30) Foreign Application Priority Data

Jun. 30, 2011 (KR) .................. 10-2011-0064984

(51) Int. Cl.
| | | |
|---|---|---|
| H01L 33/00 | (2010.01) | |
| H01L 21/28 | (2006.01) | |
| H01L 27/32 | (2006.01) | |
| H01L 51/52 | (2006.01) | |

(52) U.S. Cl.
CPC ......... *H01L 51/5275* (2013.01); *H01L 51/5215* (2013.01); *H01L 51/5271* (2013.01); *H01L 27/3244* (2013.01)
USPC .......... 257/13; 257/89; 257/98; 257/E33.008; 313/498; 313/512

(58) Field of Classification Search
CPC ......... H01L 33/00; H01L 21/28; H01L 27/32; H01L 51/5275; H01L 51/5215; H01L 27/3244; H01L 51/5271

USPC .................. 313/498–512; 257/13, E33.008, 257/E33.067, 89, 98; 428/690, 917
See application file for complete search history.

(56) References Cited

U.S. PATENT DOCUMENTS

| | | | |
|---|---|---|---|
| 2003/0137255 A1 | 7/2003 | Park et al. | |
| 2005/0088085 A1* | 4/2005 | Nishikawa et al. | 313/506 |
| 2005/0212407 A1* | 9/2005 | Matsusue | 313/503 |
| 2006/0097264 A1 | 5/2006 | Kim et al. | |
| 2006/0290274 A1* | 12/2006 | Oota | 313/506 |

(Continued)

FOREIGN PATENT DOCUMENTS

| | | |
|---|---|---|
| KR | 2003-0057018 | 7/2003 |
| KR | 10-2006-0042728 | 5/2006 |

(Continued)

*Primary Examiner* — David Vu
*Assistant Examiner* — Mouloucoulaye Inoussa
(74) *Attorney, Agent, or Firm* — Christie, Parker & Hale, LLP

(57) ABSTRACT

A light emitting device includes: a substrate; a first electrode on the substrate, the first electrode including a light-transmissive material having a refractive index greater than a refractive index of the substrate; a refraction conversion layer between the substrate and the first electrode, the refraction conversion layer including a first layer having a refractive index greater than the refractive index of the first electrode, a second layer having a refractive index smaller than the refractive index of the first layer, and a third layer having a refractive index smaller than the refractive index of the second layer, wherein the first layer, the second layer, and the third layer are sequentially formed in a direction from the first electrode toward the substrate; a second electrode facing the first electrode; and an organic emissive layer between the first electrode and the second electrode.

5 Claims, 7 Drawing Sheets

(56) References Cited

U.S. PATENT DOCUMENTS

2008/0203908 A1* 8/2008 Hasegawa et al. ............ 313/504
2009/0302750 A1 12/2009 Jun et al.
2010/0193790 A1* 8/2010 Yeo et al. ........................ 257/59
2011/0180836 A1 7/2011 Son

FOREIGN PATENT DOCUMENTS

| KR | 10-2007-0091916 | 9/2007 |
| KR | 10-2009-0120698 | 11/2009 |
| KR | 10-2009-0126955 | 12/2009 |
| KR | 10-2010-0035134 | 4/2010 |

* cited by examiner

LIGHT-EMITTING DEVICE AND ORGANIC LIGHT EMITTING DISPLAY APPARATUS INCLUDING THE SAME

CROSS-REFERENCE TO RELATED PATENT APPLICATION

This application claims priority to and the benefit of Korean Patent Application No. 10-2011-0064984, filed on Jun. 30, 2011, in the Korean Intellectual Property Office, the entire disclosure of which is incorporated herein by reference.

BACKGROUND

1. Field

Embodiments of the present invention relate to light-emitting devices and organic light-emitting display apparatuses including the light-emitting devices.

2. Description of Related Art

An organic light-emitting device generally includes an organic emissive layer interposed between first and second electrodes facing each other so that electrons injected into the first electrode and holes injected into the second electrode combine in the organic emissive layer, and light-emitting molecules of the organic emissive layer are excited due to this recombination and return to a ground state while emitting energy, and this energy is, in turn, emitted as light.

The light emitted from an emissive layer of an organic light-emitting device is emitted without any particular directivity. Generally, the light is emitted in an arbitrary direction according to a substantially uniform angular distribution of light. When light is emitted in an arbitrary direction, a considerable number of photons do not arrive at an actual observer due to total internal reflection inside the organic light-emitting device, thereby decreasing the light emitting efficiency of the organic light-emitting device.

SUMMARY

One or more embodiments of the present invention relate to light-emitting devices having improved optical characteristics and device characteristics, and organic light-emitting display apparatuses including the light-emitting devices.

According to one embodiment of the present invention, a light emitting device includes: a substrate; a first electrode on the substrate, the first electrode including a light-transmissive material having a refractive index greater than a refractive index of the substrate; a refraction conversion layer between the substrate and the first electrode, the refraction conversion layer including a first layer having a refractive index greater than the refractive index of the first electrode, a second layer having a refractive index smaller that that of the first layer, and a third layer having a refractive index smaller than the refractive index of the second layer, wherein the first layer, the second layer, and the third layer are sequentially formed from the first electrode toward the substrate; a second electrode facing the first electrode; and an organic emissive layer between the first electrode and the second electrode.

A thickness of the first layer may be smaller than a thickness of the second layer, and the thickness of the second layer may be smaller than a thickness of the third layer.

A light transmissivity of the first layer may be smaller than a light transmissivity of the second layer, and a light transmissivity of the second layer may be smaller than a light transmissivity of the third layer.

The refractive index of the first electrode may be greater than a refractive index of a material included in the organic emissive layer.

The first electrode may include a transparent conductive oxide.

The light emitting device may further include a semi-transmissive reflection layer between the first electrode and the refraction conversion layer and may be configured to transmit or to reflect light that is emitted from the organic emissive layer.

According to another aspect of the present invention, an organic light emitting display apparatus includes: a light emitting unit and a transistor on a substrate; a first electrode on the substrate, the first electrode including a light-transmissive material having a refractive index greater than a refractive index of the substrate; a refraction conversion layer between the substrate and the first electrode, the refraction conversion layer including a first layer having a refractive index greater than the refractive index of the first electrode, a second layer having a refractive index smaller than a refractive index of the first layer, and a third layer having a refractive index smaller than a refractive index of the second layer, wherein the first layer, the second layer, and the third layer are sequentially formed from the first electrode toward the substrate; a second electrode facing the first electrode; and an organic emissive layer between the first electrode and the second electrode.

A thickness of the first layer may be smaller than a thickness of the second layer, and the thickness of the second layer may be smaller than a thickness of the third layer.

A light transmissivity of the first layer may be smaller than a light transmissivity of the second layer, and a light transmissivity of the second layer may be smaller than a light transmissivity of the third layer.

The refraction conversion layer may include an insulating material.

An active layer of the transistor may include polysilicon.

A portion of the active area may include an area doped with ion impurities.

A gate electrode of the transistor may be on the same layer as the first electrode and may include: a first layer comprising the same material as the first electrode; and a second layer on the first layer, the second layer including a metal having an electrical resistance lower than that of the first layer.

The second layer of the refraction conversion layer may include silicon nitride and the third layer of the refraction conversion layer may include silicon oxide.

The organic light emitting display apparatus may further include a capacitor including at least two electrodes, wherein the refraction conversion layer is between the at least two electrodes of the capacitor.

One of the at least two electrodes of the capacitor may include a polysilicon.

The one of the at least two electrodes including polysilicon may be doped with ion impurities.

The other of the two electrodes of the capacitor may be in the same layer as the first electrode and may include the same material as that of the first electrode.

The second layer of the refraction conversion layer may include silicon nitride and the third layer of the refraction conversion layer may include silicon oxide.

The organic light emitting display apparatus may further include a semi-transmissive reflection layer between the first electrode and the refraction conversion layer and may be configured to transmit or to reflect light emitted from the emissive layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Embodiments of the present invention will now be described more fully with reference to the accompanying drawings, in which exemplary embodiments of the invention are shown.

Figure 1:
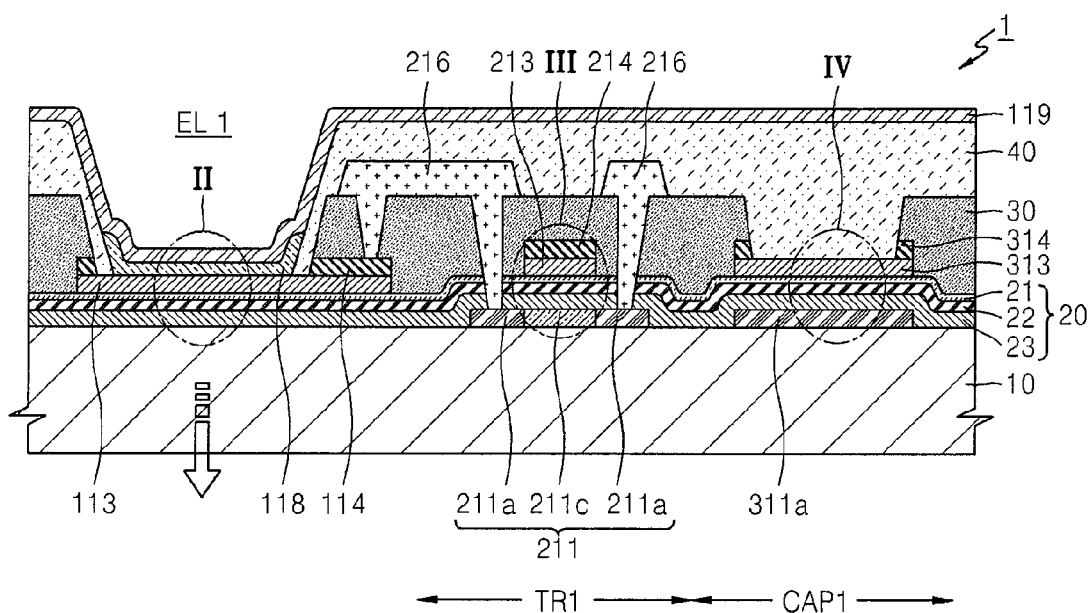
FIG. 1 is a cross-sectional view illustrating an organic light-emitting display apparatus according to an embodiment of the present invention.
Figure 2:
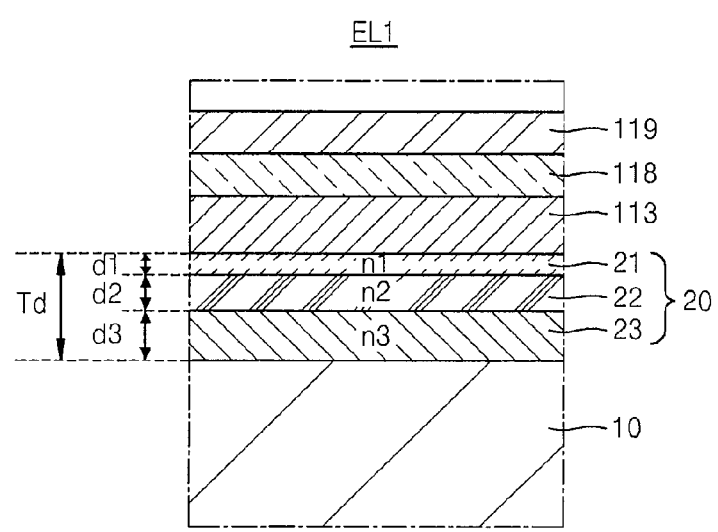
FIG. 2 is an expanded cross-sectional view of a portion II of the organic light-emitting display apparatus of FIG. 1.
Figure 3:
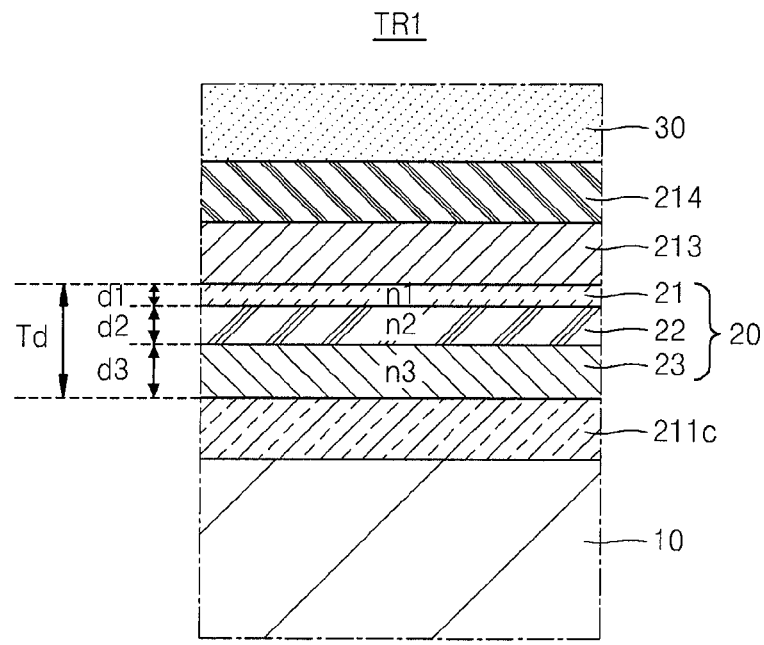
FIG. 3 is an expanded cross-sectional view of a portion III of the organic light-emitting display apparatus of FIG. 1.
Figure 4:
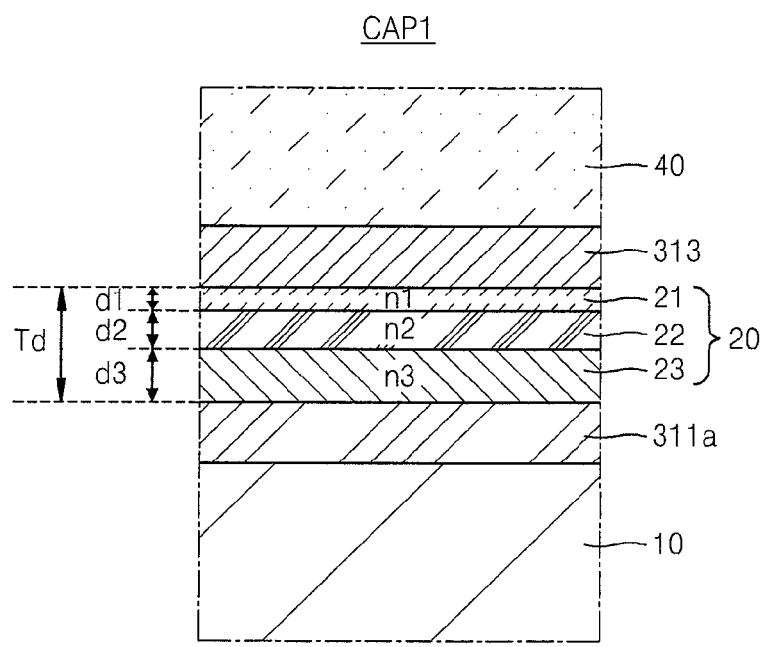
FIG. 4 is an expanded cross-sectional view of a portion IV of the organic light-emitting display apparatus of FIG. 1.

FIG. 1 is a cross-sectional view illustrating an organic light-emitting display apparatus 1 according to one embodiment of the present invention. FIG. 2 is an expanded cross-sectional view of a portion II of the organic light-emitting display apparatus of FIG. 1. FIG. 3 is an expanded cross-sectional view of a portion III of the organic light-emitting display apparatus of FIG. 1. FIG. 4 is an expanded cross-sectional view of a portion IV of the organic light-emitting display apparatus of FIG. 1.

Referring to FIG. 1, the organic light-emitting display apparatus 1 includes a light emitting unit EL1, a transistor TR1, and a capacitor CAP1. While one transistor TR1 and one capacitor CAP1 are illustrated in the organic light-emitting display apparatus 1 for convenience of description, embodiments of the present invention are not limited thereto, and a plurality of transistors TR1 and a plurality of capacitors CAP1 may also be included.

The light emitting unit EL1 having an organic emissive layer 118, from which light is emitted and which is disposed between a first electrode 113 and a second electrode 119, is formed on a substrate 10. In some embodiments, a buffer layer that blocks penetration of impurity elements through the substrate 110 and planarizes a surface of the substrate 10 may be further formed.

The organic emissive layer 118 may include a low molecular organic material or a polymer organic material. When the organic emissive layer 118 includes a low molecular organic material, a hole transport layer (HTL), a hole injection layer (HIL), an electron transport layer (ETL), and an electron injection layer (EIL) may be stacked around the organic emissive layer 118. Besides these layers, in some embodiments, other various layers may be stacked with the low molecular weight organic material.

Examples of organic materials that may be used herein include copper phthalocyanine (CuPc), N,N'-Di(naphthalene-1-yl)-N,N'-diphenyl-benzidine (NPB), and tris-8-hydroxyquinoline aluminum (Alq3). Meanwhile, when the organic emissive layer 118 is a polymer organic material, at least an HTL may be formed in addition to the organic emissive layer 118. The HTL may be formed of, for example, poly(3,4-ethylenedioxythiophene) (PEDOT) or polyaniline (PANI). Examples of organic materials that may be used herein include poly-phenylene vinylene (PPV) polymer organic materials and polyfluorene organic materials. A refractive index of the above-described organic emissive layer 118 may vary according to process conditions but may be in a range from about 1.7 to about 1.8.

Light emitted from the organic emissive layer 118 may be emitted through the first electrode 113 or the second electrode 119. Accordingly, at least one of the first electrode 113 and the second electrode 119 may comprise a light transmissive material, and the other of the first electrode 113 and the second electrode 119 may be a reflective electrode (e.g., may include a light reflective material).

In the organic light emitting display apparatus 1 according to one embodiment of the present invention, the first electrode 113 is used as a transparent electrode, and the second electrode 119 is used as a reflective electrode.

The first electrode 113 may include a transparent conductive oxide. For example, the first electrode 113 may include at least one compound selected from the group consisting of indium tin oxide (ITO), indium zinc oxide (IZO), zinc oxide (ZnO), indium oxide ($In_2O_3$), indium gallium oxide (IGO), aluminum zinc oxide (AZO), and combinations thereof.

When light generated in the organic emissive layer 118 is emitted through the first electrode 113, and if a refractive index of the organic emissive layer 118 is greater than that of the first electrode 113, total internal reflection occurs at an interface between the organic emissive layer 118 and the first electrode 113 and light extraction efficiency is decreased accordingly. Thus, if the refractive index of the organic emissive layer 118 is less than or equal to that of the first electrode 113, a decrease in light extraction efficiency of the light emitting device may be reduced or prevented. For example, if the refractive index of the organic emissive layer 118 is in a range from about 1.7 to about 1.8, the first electrode 113 may include a transparent conductive oxide that varies in a wide range from about 1.8 to about 2.2 according to process conditions.

The second electrode 119 may be formed of a reflective electrode comprising a reflective material. For example, the second electrode 119 may include at least one material selected from the group consisting of Al, Mg, Li, Ca, LiF/Ca, LiF/Al, and combinations thereof.

According to one embodiment of the present invention, light emitted from the organic emissive layer 118 is reflected by the second electrode 119 and is transmitted through the first electrode 113 and the substrate 10 to be emitted from the organic light emitting display apparatus (e.g., emitted into the air).

Generally, the greater the transparency of the substrate 10, the higher the efficiency of the organic light emitting display apparatus 1. A soda lime based glass substrate, which is typically used as a transparent substrate, may be used as the substrate 10. Because a refractive index of the substrate 10 is greater than that of air, total internal reflection may be generated at an interface between the substrate 10 and the air.

Moreover, when the refractive index of the first electrode 113, which is a transparent electrode is from about 1.8 to about 2.2, and the refractive index of the substrate 10, which is a transparent glass substrate is about 1.5, that is, the refractive index of the substrate 10, is smaller than that of the first electrode 113, a considerable amount of total internal reflection may be generated at an interface between the first electrode 113 and the substrate 10.

According to one embodiment of the present invention, the organic light emitting display apparatus 1 includes a refraction conversion layer 20 that is disposed between the first electrode 113 and the substrate 10 in order to reduce or prevent total internal reflection due to a difference between the refractive indices of the first electrode 113 and the substrate 10.

Referring to FIG. 2, the refraction conversion layer 20 is disposed between the substrate 10 and the first electrode 113 and includes a first layer 21, a second layer 22, and a third layer 23 that are sequentially disposed in a direction from the first electrode 113 toward the substrate 10.

The first layer 21 has a greater refractive index than that of the first electrode 113 described above. This is because total internal reflection occurring at the interface between the first electrode 113 and the substrate 10 may be reduced or prevented when the refractive index of the first layer 21 is greater than that of the first electrode 113 in order to reduce or prevent a decrease in light efficiency. Accordingly, a refractive index of the first layer 21 may be greater than the refractive index of the first electrode 113 including the above-described transparent conductive oxide (e.g., a refractive index greater than about 1.8 to about 2.2). Examples that may be used as the material of the first layer 21 include materials including oxides, nitrides, and oxynitrides of materials such as niobium, titanium, tantalum, zirconium, and molybdenum. Embodiments of the present invention are not limited thereto, and the first layer 21 may also be formed of other various materials having a refractive index greater than that of the first electrode 113.

The second layer 22 of the refraction conversion layer 20 has a refractive index smaller than that of the first layer 21, and the third layer 23 is formed of a material having a refractive index smaller than that of the second layer 22. That is, the refractive index of the refraction conversion layer 20 gradually decreases from the first electrode 113 toward the substrate 10. Accordingly, a difference in color conversion (or a color shift) according to a variation in viewing angles of the organic light emitting display apparatus 1 caused by a variation in the refractive index of the refraction conversion layer 20 may be reduced.

Meanwhile, in inverse proportion to the refractive indices of the first layer 21, the second layer 22, and the third layer 23 of the refraction conversion layer 20, a thickness d1 of the first layer 21 may be formed to be smaller than a thickness d2 of the second layer 22, and the thickness d2 of the second layer d2 may be formed to be smaller than a thickness d3 of the third layer 23. In addition, light transmissivity of the first layer 21 of the refraction conversion layer 20 may be smaller (or lower) than light transmissivity of the second layer 22, and the light transmissivity of the second layer 22 may be smaller than a light transmissivity of the third layer 23. Various combinations of thicknesses are possible; for example, the thickness d1 of the first layer 21 may be about 20 nm, the thickness d2 of the second layer 22 may be about 40 nm, and the thickness d3 of the third layer d3 may be about 60 nm. However, a total thickness Td of the refraction conversion layer 20 may be maintained uniformly (e.g., the total thickness of conversion layer 20 is substantially constant). If the total thickness Td of the refraction conversion layer 20 is too large, light transmissivity may be degraded.

Referring to FIG. 3, the refraction conversion layer 20, in which the first layer 21, the second layer 22, and the third layer 23 are sequentially disposed between an active layer 211 and gate electrodes 213 and 214 of a transistor TR1 in a direction from the gate electrodes 213 and 214 toward the active layer 211, is formed. The refraction conversion layer 20 functions as a gate insulating layer of the transistor TR1.

The second layer 22 of the refraction conversion layer 20 is formed of a material having a refractive index smaller than that of the first layer 21, and the third layer 23 is formed of a material having a refractive index smaller than that of the second layer 22. Here, the second layer 22 and the third layer 23 may be formed of a silicon nitride (SiNx) having a refractive index of about 2.0 and a silicon oxide ($SiO_2$) having a refractive index of about 1.5, respectively.

By forming the third layer 23, which directly contacts the active layer 211 (e.g., the channel area 211c of the active layer 211), using $SiO_2$, an effect of a threshold voltage Vth variation which may occur when forming a channel of the transistor TR1 may be reduced.

In addition, when the active layer 211 is formed of polysilicon, silicon nitride may be used as a gate insulating layer so as to improve characteristics of the transistor TR1. This is believed to be so because hydrogen, which is present when forming a silicon nitride and which is supplied from a silane gas, fills defect sites of the active layer 211 formed of polysilicon, thereby increasing electron mobility of the transistor TR1.

Because the refraction conversion layer 20 functions as a gate insulating layer of the transistor TR1, according to one embodiment of the present invention, the total thickness Td of the refraction conversion layer 20 is substantially uniform. According to one embodiment of the present invention, the refraction conversion layer 20 has a thickness of about 2 nm to about 200 nm. If the refraction conversion layer 20 is too thin, a leakage current may increase, and if too thick, the size of the transistor TR1 may unduly increase.

Referring to FIG. 4, the refraction conversion layer 20, in which the first layer 21, the second layer 22, and the third layer 23 are sequentially disposed, is disposed between a top electrode 313 and a bottom electrode 311a of the capacitor CAP1 in a direction from the top electrode 313 toward the bottom electrode 311a. The refraction conversion layer 20 functions as a dielectric layer of the capacitor CAP1.

The second layer 22 of the refraction conversion layer 20 is formed of a material having a refractive index smaller than that of the first layer 21, and the third layer 23 is formed of a material having a refractive index smaller than that of the second layer 22. Here, the second layer 22 and the third layer 23 may be formed of a silicon nitride (SiNx) having a refractive index of about 2.0 and a silicon oxide ($SiO_2$) having a refractive index of about 1.5, respectively.

When only silicon oxide is used to form a dielectric layer of a capacitor, and the dielectric layer is formed to be thin to increase an electrostatic capacity of the capacitor, then a problem associated with static electricity may occur. However, by using the second layer 22 and the first layer 21 which comprise silicon nitride having greater permittivity than that of a silicon oxide as dielectric layers, static electricity may be reduced or prevented, and the electrostatic capacity of the capacitor CAP1 may be increased.

The bottom electrode 311a of the capacitor CAP1 may be formed of polysilicon like the active layer 211. Here, hydrogen, which is supplied from a silane gas, which is present when forming the silicon nitride layer that is used as a dielectric layer, fills defect sites of the bottom electrode 311a of the capacitor CAP1, thereby fixing defects of the capacitor CAP1.

According to one embodiment of the present invention, the refraction conversion layer 20 functions as a dielectric layer of the capacitor CAP1 and the total thickness Td of the refraction conversion layer 20 is substantially uniform. According to one embodiment of the present invention, the refraction conversion layer 20 has a thickness of about 2 nm to about 200 nm. If the refraction conversion layer 20 is too thin, a leakage current may increase, and if too thick, the size of the capacitor CAP1 increases.

FIGS. 5 through 9 are cross-sectional views illustrating a method of manufacturing an organic light-emitting display apparatus 1 according to one embodiment of the present invention.

Figure 5:
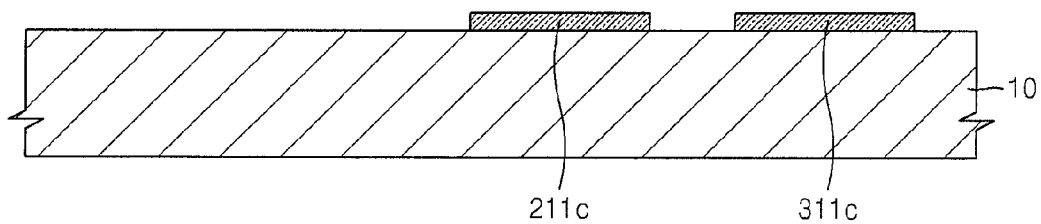
FIGS. 5 through 9 are cross-sectional views illustrating a method of manufacturing an organic light-emitting display apparatus according to an embodiment of the present invention.

FIG. 5 illustrates a result of a first mask operation performed in the method of manufacturing the organic light emitting display apparatus 1 according to one embodiment of the present invention.

Referring to FIG. 5, an active layer 211c of a transistor and bottom electrode 311c of a capacitor are formed on a substrate 10.

The substrate 10 may be formed of a transparent glass material including $SiO_2$ as a main component, and a buffer layer including $SiO_2$ and/or $SiN_x$ may be further formed on the substrate 10 so as to planarize the substrate 10 and to reduce or prevent penetration of impurity elements.

A semiconductor layer is deposited on the substrate 10, and then the semiconductor layer is coated with a photoresist and patterned using a photolithography process by using a first photomask, thereby forming the active layer 211c of the transistor and the bottom electrode 311c of the capacitor at the same time. The first mask operation by using the photolithography process may include sequentially performed operations such as exposing the first photomask by using an exposure apparatus, then developing, etching, and stripping or ashing.

The semiconductor layer may be formed of polysilicon. The polysilicon may be formed by crystallizing amorphous silicon. Examples of methods of crystallizing the amorphous silicon are a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

Figure 6:
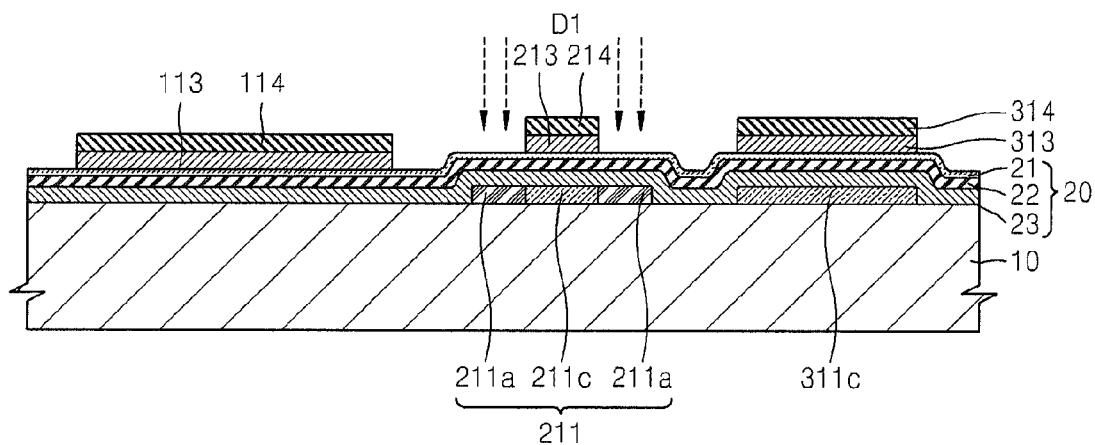

FIG. 6 is a schematic view illustrating a result of a second mask operation performed in the method of manufacturing of the organic light emitting display apparatus 1 according to one embodiment of the present invention.

Referring to FIG. 6, a refraction conversion layer 20 is formed on a resultant product of the first mask operation, and a transparent conductive oxide and a metal-containing layer are sequentially stacked on the refraction conversion layer 20, and then the refraction conversion layer 20 is patterned.

As a result of the patterning, a first electrode 113 and a top electrode 114 of the first light emitting unit EL1, respectively including a transparent conductive oxide and a metal, are sequentially formed in a light emitting unit (EL) on the refraction conversion layer 20, and a first gate electrode 213 including a transparent conductive oxide and a second gate electrode 214 including a metal are sequentially formed on a transistor TR1, and in a capacitor area CAP1, first and second top electrodes 313 and 314 of a capacitor, which include a transparent conductive oxide and a metal, are concurrently formed.

In one embodiment of the present invention, in the refraction conversion layer 20, the third layer 23 which has the smallest refractive index is formed to be the thickest layer on the substrate 10, and then the second layer 22 which has a refractive index greater than that of the third layer 23 is formed on the third layer 23 to be thinner than the third layer 23, and the first layer 21 having a refractive index greater than that of the second layer 22 is formed on the second layer 22 to be thinner than the second layer 22.

Examples of transparent conductive materials that form the first electrode 113, the first gate electrode 213, and the first top electrode 313 of the capacitor may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Examples of metals that form the top electrode 114 of the first electrode 113, the second gate electrode 214, and the second top electrode 314 of the capacitor CAP1 include at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and combinations thereof, and each of these layers may be formed as a single layer or as multiple layers.

The above structure is doped with B or P ions at a density of $1 \times 10^{15}$ atoms/cm$^2$ or greater by using the first and second gate electrodes 213 and 214 as a self-align mask and setting the active layer 211c of the transistor as a target (D1). The active layer 211 includes source and drain areas 211a doped with ion impurities and a channel area 211c interposed therebetween.

Figure 7:
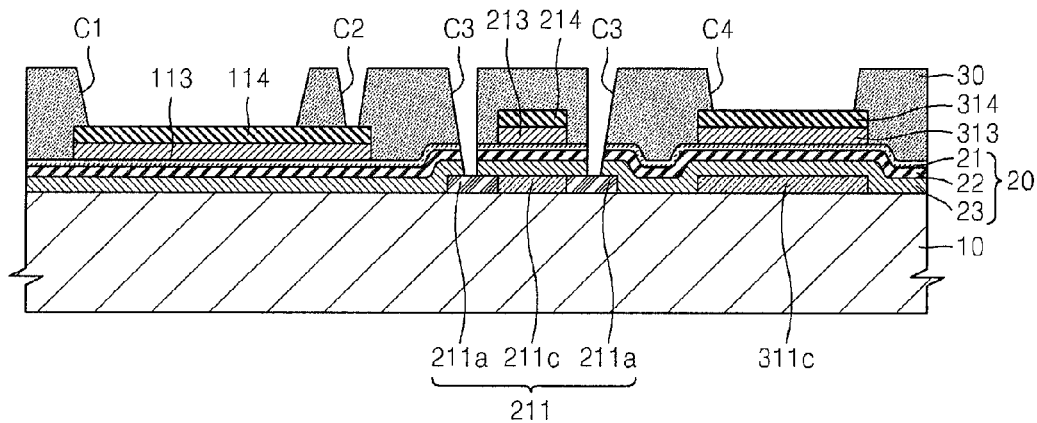

FIG. 7 is a schematic cross-sectional view illustrating a result of a third mask operation performed in the method of manufacturing of the organic light emitting display apparatus 1 according to an embodiment of the present invention.

Referring to FIG. 7, an interlayer insulating layer 30 is stacked on a resultant product of the second mask operation. The interlayer insulating layer 30 is patterned to form a first contact hole C1 exposing the top electrode 114 of the light emitting unit EL1, a second contact hole C2 exposing a portion of the top electrode 114 of the light emitting unit EL1 so as to connect the first electrode 113 and the top electrode 114 to the source and drain electrodes 216 (see, e.g., FIG. 8), a third contact hole C3 exposing a portion of the source and drain areas 211a of the active layer 211, and a fourth contact hole C4 exposing the second top electrode 314 of the capacitor CAP1.

Figure 8:
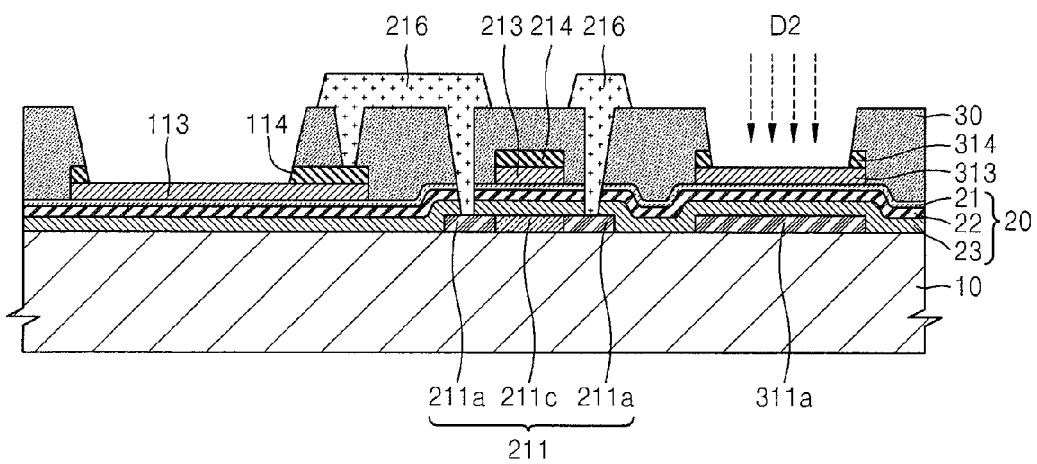

Referring to FIG. 8, the source and drain electrodes 216 are formed on a resultant product of the third mask operation. The source and drain electrodes 216 may be formed of at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and combinations thereof as a single layer or as multiple layers.

The top electrode 114 of the first electrode 113 and the second top electrode 314 of the capacitor CAP1 may be removed using an etching operation together with the material for forming the source and drain electrodes 216 formed on the top electrode 114 of the first electrode 113 and the second top electrode 314 of the capacitor CAP1.

After the fourth mask operation is performed, the structure as described above is doped with ion impurities for the second time (D2). As described above, the ion impurities may comprise Group 3 or Group 5 ions, and the structure may be doped with the ion impurities at a density of $1 \times 10^{15}$ atoms/cm$^2$ or greater and by setting the first electrode 311c as a target. Consequently, the first electrode 311a of the capacitor doped with ion impurities form a metal-insulator-metal capacitor (MIM CAP) structure together with the first top electrode 313 of the capacitor CAP1, and thus a voltage design margin may be improved when designing a circuit.

Figure 9:
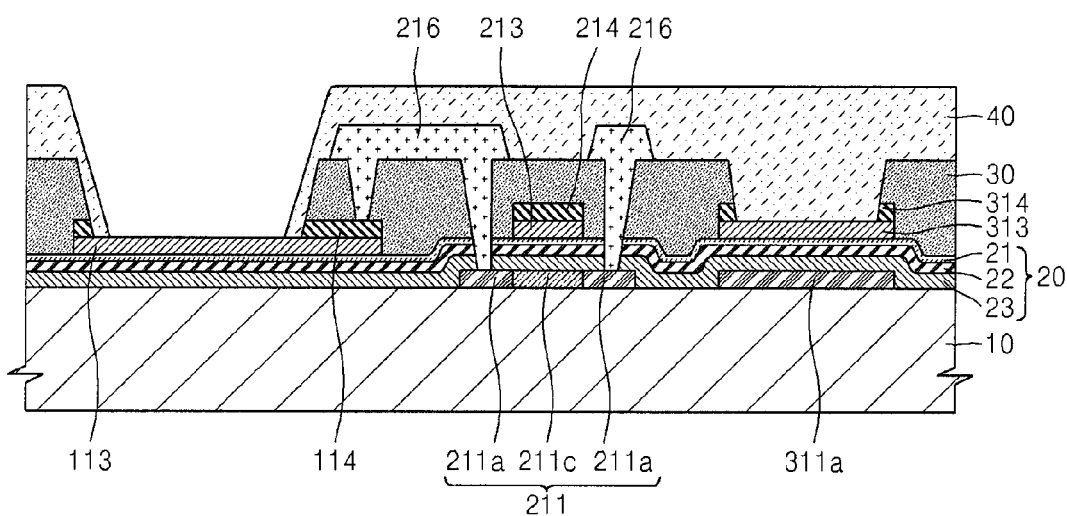

FIG. 9 is a cross-sectional view illustrating a resultant product of a fifth mask operation performed in the method of manufacturing of the organic light emitting display apparatus 1 according to one embodiment of the present invention.

Referring to FIG. 9, a pixel defining layer 40 is formed on the resultant product of the fourth mask operation, and an opening C5 exposing an upper surface of the first pixel electrode 113 is formed.

Because the emissive layer 118 (see FIG. 1) is formed inside the opening C5, light is emitted from the emissive layer 118 in accordance with a voltage applied to the first electrode 113 and the second electrode 119 (see FIG. 1).

According to an organic light emitting display apparatus 1 in accordance with embodiments of the present invention described above, the first layer 21 having a greater refractive index than that of the first electrode 113 is formed between the substrate 10 and the first electrode 113 to thereby reduce or prevent total internal reflection generated at an interface between the first electrode 113 and the substrate 10 and thus reduce or prevent a decrease in light efficiency. Also, because the refraction conversion layer 20, whose refractive index is gradually reduced in a direction from the first electrode 113 toward the substrate 10, is formed between the substrate 10 and the first electrode 113, a difference in color conversion (or a color shift) at different viewing angles caused by a variation in the refractive index of the refraction conversion layer may be reduced. Moreover, the refraction conversion layer 20 functions as a gate insulating layer of a transistor and/or a dielectric layer of a capacitor, and thus may affect device characteristics of the transistor and the capacitor.

Hereinafter, an organic light emitting display apparatus 2 according to another embodiment of the present invention will be described briefly with reference to FIGS. 10 through 13.

Figure 10:
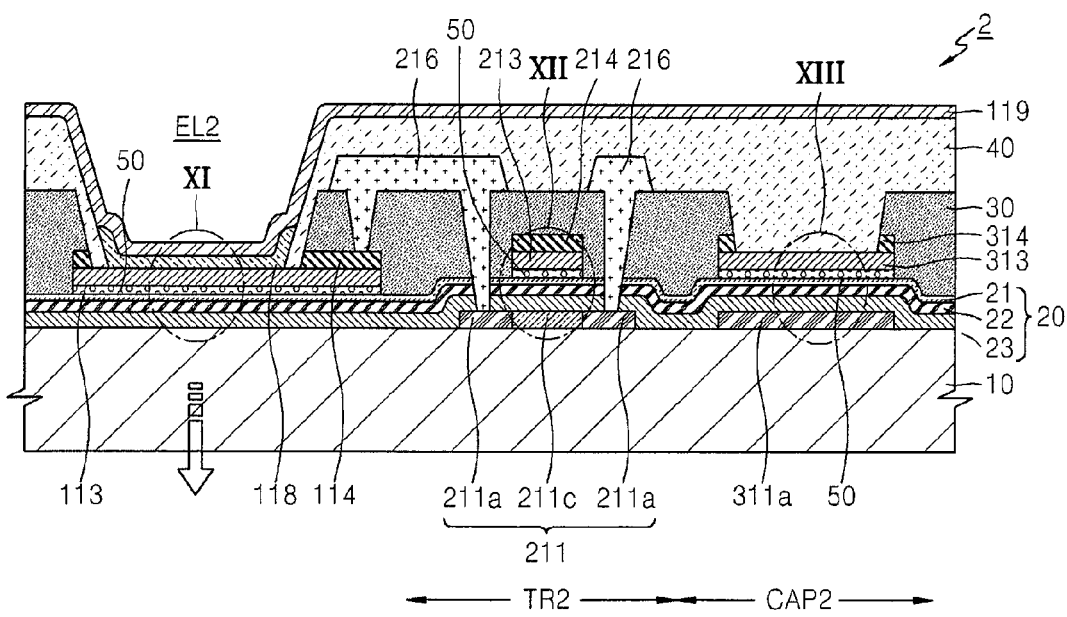
FIG. 10 is a cross-sectional view illustrating a portion of an organic light-emitting display apparatus according to another embodiment of the present invention.
Figure 11:
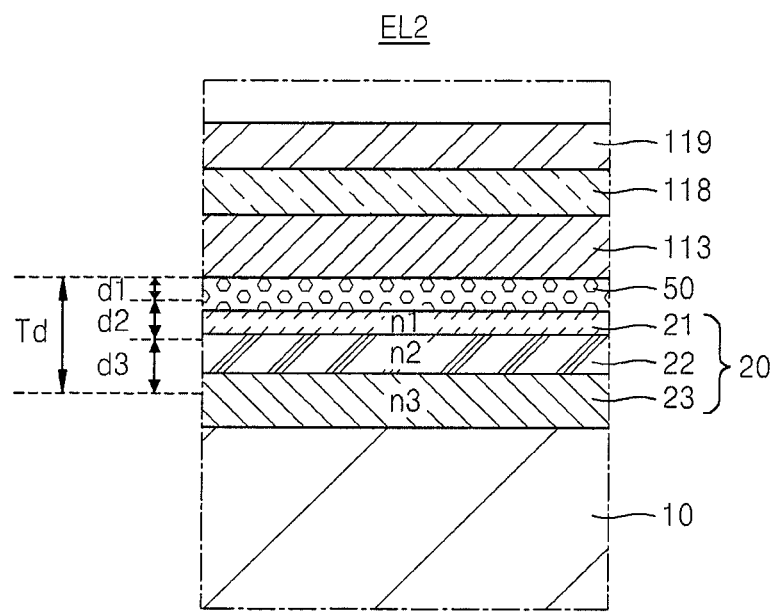
FIG. 11 is an expanded cross-sectional view of a portion XI of the organic light-emitting display apparatus of FIG. 10.
Figure 12:
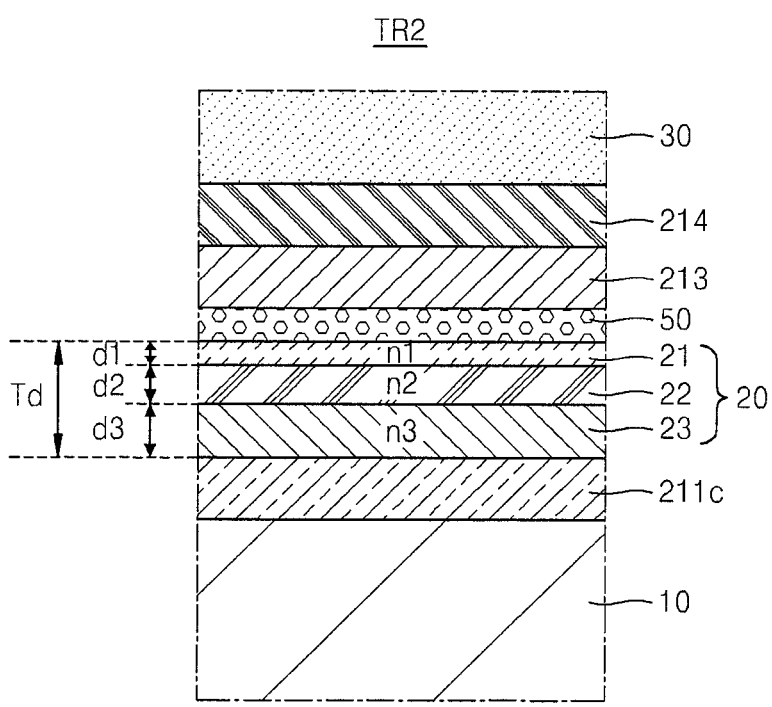
FIG. 12 is an expanded cross-sectional view of a portion XII of the organic light-emitting display apparatus of FIG. 10.
Figure 13:
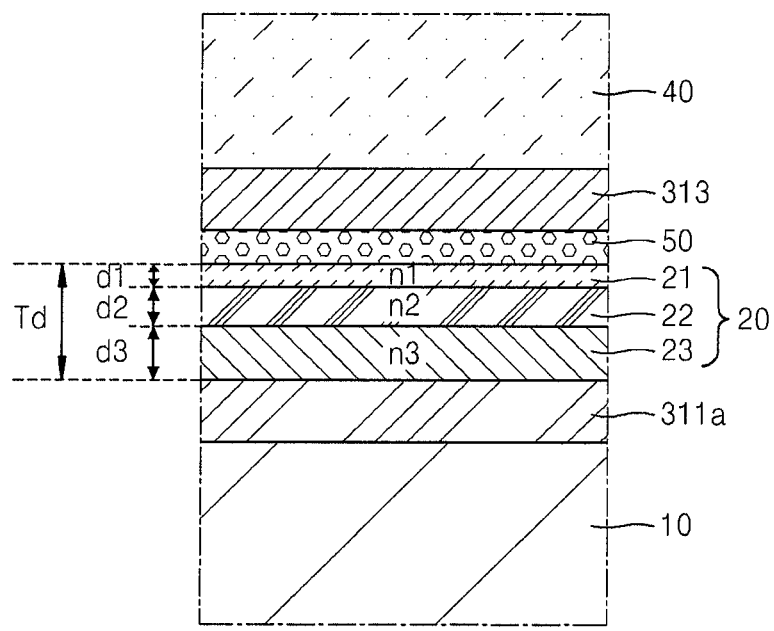
FIG. 13 is an expanded cross-sectional view of a portion XIII of the organic light-emitting display apparatus of FIG. 10.

FIG. 10 is a cross-sectional view illustrating a portion of an organic light-emitting display apparatus 2 according to another embodiment of the present invention. FIG. 11 is an expanded cross-sectional view of a portion XI of the organic light-emitting display apparatus of FIG. 10. FIG. 12 is an expanded cross-sectional view of a portion XII of the organic light-emitting display apparatus of FIG. 10. FIG. 13 is an expanded cross-sectional view of a portion XIII of the organic light-emitting display apparatus of FIG. 10.

Hereinafter, the description of the organic light emitting display apparatus 2 will focus on differences from the organic light emitting display apparatus 1 of the embodiments described above; like reference numerals denote like elements.

Referring to FIGS. 10, 11, 12, and 13, the organic light emitting display apparatus 2 includes a light emitting unit EL2, a transistor TR2, and a capacitor CAP2.

In the light emitting unit EL2 according to one embodiment of the present invention, an organic emissive layer 118 is disposed between a first electrode 113 and a second electrode 119 on a substrate 10, a refraction conversion layer 20 is formed between the first electrode 113 and the substrate 10, and a semi-transmissive reflection layer 50 is further disposed between the refraction conversion layer 20 and the first electrode 113.

Light emitted from the organic emissive layer 118 may be emitted through the first electrode 113 or the second electrode 119. Accordingly, at least one of the first electrode 113 and the second electrode 119 may be a transparent electrode including a light transmissive material, and the other of the first electrode 113 and the second electrode 119 may be a reflective electrode. In the organic light-emitting display apparatus 2, the first electrode 113 is used as a transparent electrode, and the second electrode 119 is used as a reflective electrode.

A refractive index of a first layer 21 of the refraction conversion layer 20 is greater than a refractive index of the first electrode 113, thereby reducing or preventing total internal reflection generated at an interface between the first electrode 113 and the substrate 10. In addition, a refractive index of the refraction conversion layer 20 is designed so as to decrease in a direction from the first electrode 113 toward the substrate 10, and thus a difference in color conversion (or a color shift) at different viewing angles caused by a variation in the refractive index of the refraction conversion layer 20 may be reduced.

Meanwhile, in the organic light emitting display apparatus 2, light emitted from the organic emissive layer 118 is reflected by the second electrode 119 and is emitted through the first electrode 113 which is a transparent electrode; on the other hand, light emitted from the first electrode 113 is not immediately emitted through the substrate 10 but is partially reflected by the semi-transmissive reflection layer 50. The light reflected by the semi-transmissive reflection layer 50 resonates between the second electrode 119 and the semi-transmissive reflection layer 50. That is, in the organic light emitting display apparatus 2, an optical resonance structure is formed in which the second electrode 119 is used as a reflection mirror, and the semi-transmissive reflection layer 50 is used as a semi-transmissive mirror. Accordingly, light efficiency of the organic light emitting display apparatus 2 may be increased. In particular, light efficiency of a blue color, which may have lower efficiency than other colors in a full-color organic light emitting display apparatus, may be improved.

The above-described semi-transmissive reflection layer 50 may be formed of aluminum (Al), silver (Ag), or a silver alloy. As a silver alloy, silver may be included as a main component and palladium (Pd) or copper (Cu) may be further included.

The semi-transmissive reflection layer 50 may have a thickness from 50 Å to 200 Å. If the thickness of the semi-transmissive reflection layer 50 is thinner than 50 Å, reflectivity thereof is decreased and thus optical resonance may be difficult to form between the semi-transmissive reflection layer 50 and the second electrode 119 which is a reflective electrode. If the thickness of the semi-transmissive reflection layer 50 is thicker than 200 Å, transmissivity thereof may decrease, and this may decrease light efficiency thereof.

In the transistor TR2 of the organic light emitting display apparatus 2, the refraction conversion layer 20 is disposed between the active layer 211 and the gate electrodes 50, 213, and 214 in a direction from the gate electrodes 50, 213, and 214 toward the active layer 211. Compared to the previous embodiment, the current embodiment is different in that the semi-transmissive reflection layer 50 is further formed at the bottom of the gate electrodes 50, 213, and 214.

In the capacitor CAP2 of the organic light emitting display apparatus 2, the refraction conversion layer 20 is disposed between the top electrodes 50 and 313 and the bottom electrode 311a in a direction from the top electrodes 50 and 313 toward the bottom electrode 311a. The refraction conversion layer 20 functions as a dielectric layer of the capacitor CAP2. Compared to the previous embodiment, the current embodiment is different in that the semi-transmissive reflection layer 50 is further formed at the bottom of the top electrodes 50 and 313.

Accordingly, the organic light emitting display apparatus 2 further includes the semi-transmissive reflection layer 50 between the refraction conversion layer 20 and the first electrode 113 to thereby form an optical resonance structure. Thus, in addition to the effects described with reference to the organic light emitting display apparatus 1 according to the previous embodiment, light efficiency of the organic light emitting display apparatus 2 may be further increased.

According to the light-emitting devices and the organic light emitting display apparatuses of the embodiments of the present invention, the following effects may be provided:

First, a first layer having a greater refractive index than that of a first electrode is disposed between a substrate and the first electrode so as to reduce or prevent total internal reflection occurring on an interface between the first electrode and the substrate, thereby reducing or preventing a decrease in light efficiency.

Second, a refraction conversion layer whose refractive index gradually decreases in a direction from the first electrode toward the substrate is disposed between the substrate and the first electrode, thereby reducing a difference in color conversion (or a color shift) at different viewing angles caused by a variation in a refractive index of the refraction conversion layer.

Third, the refraction conversion layer functions as a gate insulating layer of a transistor and/or a dielectric layer of a capacitor to improve the characteristics of the transistor and the capacitors.

While this invention has been particularly shown and described with reference to exemplary embodiments thereof, it will be understood by those of ordinary skill in the art that various changes in form and details may be made therein without departing from the spirit and scope of the invention as defined by the appended claims and equivalents thereof. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A light emitting device comprising:
   a substrate;
   a first electrode on the substrate, the first electrode comprising a light-transmissive material having a refractive index greater than a refractive index of the substrate;
   a refraction conversion layer between the substrate and the first electrode, the refraction conversion layer comprising a first layer having a refractive index greater than the refractive index of the first electrode, a second layer having a refractive index smaller than the refractive index of the first layer, and a third layer having a refractive index smaller than the refractive index of the second layer,
   wherein the first layer, the second layer, and the third layer are sequentially formed in a direction from the first electrode toward the substrate;
   a second electrode facing the first electrode; and
   an organic emissive layer between the first electrode and the second electrode,
   wherein the refractive index of the first electrode is in a first range and a refractive index of a material included in the organic emissive layer is in a second range, and
   wherein the lower end of the first range is greater than or equal to the upper end of the second range.

2. The light emitting device of claim 1, wherein a thickness of the first layer is smaller than a thickness of the second layer, and the thickness of the second layer is smaller than a thickness of the third layer.

3. The light emitting device of claim 1, wherein a light transmissivity of the first layer is smaller than a light transmissivity of the second layer, and a light transmissivity of the second layer is smaller than a light transmissivity of the third layer.

4. The light emitting device of claim 1, wherein the first electrode comprises a transparent conductive oxide.

5. The light emitting device of claim 1, further comprising a semi-transmissive reflection layer between the first electrode and the refraction conversion layer and configured to transmit or to reflect light that is emitted from the organic emissive layer.

* * * * *